United States Patent
Subramanian et al.

[11] Patent Number: 5,665,202
[45] Date of Patent: Sep. 9, 1997

[54] MULTI-STEP PLANARIZATION PROCESS USING POLISHING AT TWO DIFFERENT PAD PRESSURES

[75] Inventors: Chitra K. Subramanian; Asanga H. Perera; James D. Hayden; Subramoney V. Iyer, all of Austin, Tex.

[73] Assignee: Motorola, Inc., Schaumburg, Ill.

[21] Appl. No.: 562,440

[22] Filed: Nov. 24, 1995

[51] Int. Cl.$^6$ .................................................. H01L 21/306
[52] U.S. Cl. .............................. 438/692; 216/88; 216/2; 216/11; 438/699; 438/427
[58] Field of Search .......................... 156/636.1, 645.1; 216/88, 89, 2, 11; 437/228, 238

[56] References Cited

U.S. PATENT DOCUMENTS

| | | | |
|---|---|---|---|
| 4,671,851 | 6/1987 | Beyer et al. | 156/645 |
| 4,811,522 | 3/1989 | Gill, Jr. | 51/131.1 |
| 4,889,586 | 12/1989 | Noguchi et al. | 156/636.1 |
| 5,006,482 | 4/1991 | Kerbaugh et al. | 437/67 |
| 5,064,683 | 11/1991 | Poon et al. | 427/39 |
| 5,173,439 | 12/1992 | Dash et al. | 437/67 |
| 5,232,875 | 8/1993 | Tuttle et al. | 216/89 |
| 5,290,396 | 3/1994 | Schoenborn et al. | 156/636 |
| 5,308,438 | 5/1994 | Cote et al. | 216/88 |
| 5,356,513 | 10/1994 | Burke et al. | 156/636.1 |
| 5,395,801 | 3/1995 | Doan et al. | 437/225 |
| 5,459,096 | 10/1995 | Venkatesan et al. | 437/67 |
| 5,486,265 | 1/1996 | Salugsugan | 156/636.1 |
| 5,502,007 | 3/1996 | Murase | 156/636.1 |
| 5,514,245 | 5/1996 | Doan et al. | 156/636.1 |
| 5,522,965 | 6/1996 | Chisholm et al. | 156/636.1 |
| 5,540,811 | 7/1996 | Morita | 156/636.1 |

FOREIGN PATENT DOCUMENTS 2-178926  7/1990  Japan.

*Primary Examiner*—R. Bruce Breneman
*Assistant Examiner*—Anita Alanko

[57] ABSTRACT

A process for polish planarizing a fill material (40) overlying a semiconductor substrate (30) includes a multi-step polishing process. In one embodiment, a second planarization layer (42) is deposited over a fill material (40) and a portion of the fill material (40) is removed leaving a remaining portion (44). The pad pressure of a CMP apparatus (20) is adjusted such that a first pressure is generated during the polishing process. Then, the remaining portion (44) is removed, while operating the CMP apparatus (20) at a second pad pressure. The selectivity of the polishing process is maintained by reducing the pad pressure during the second polishing step. In a second embodiment, after the first polishing step is performed, the remaining portion (44) is removed by an etching process using a portion (46) of second planarization layer (42).

20 Claims, 4 Drawing Sheets

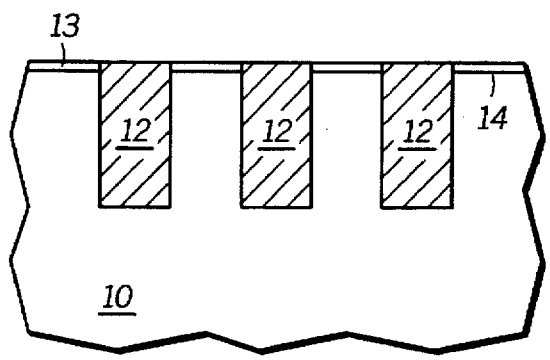
FIG.1-a
-PRIOR ART-
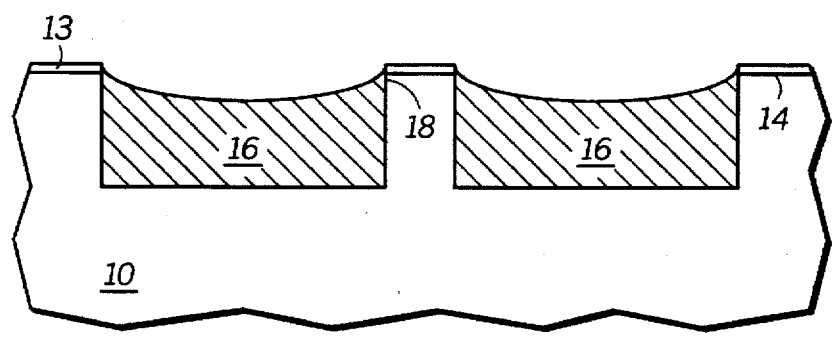
FIG.1-b
-PRIOR ART-
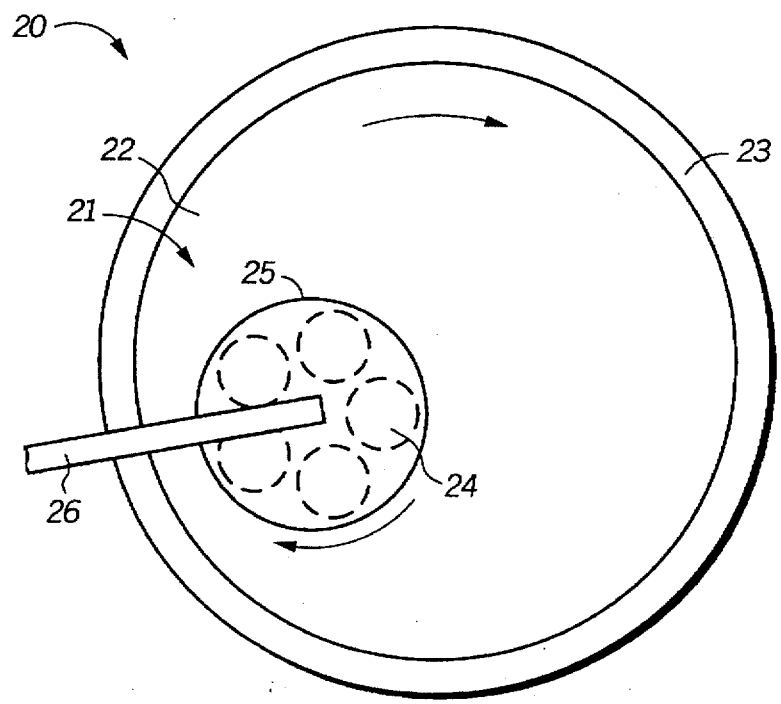
FIG.2

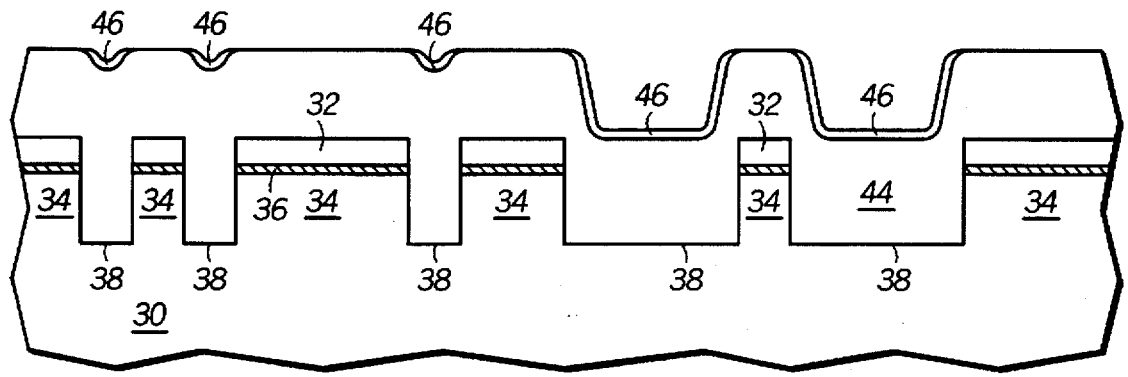
*FIG.6*
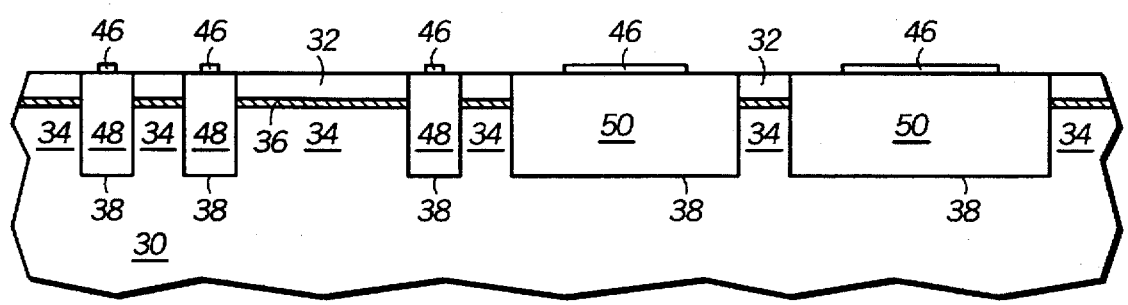
*FIG.7*
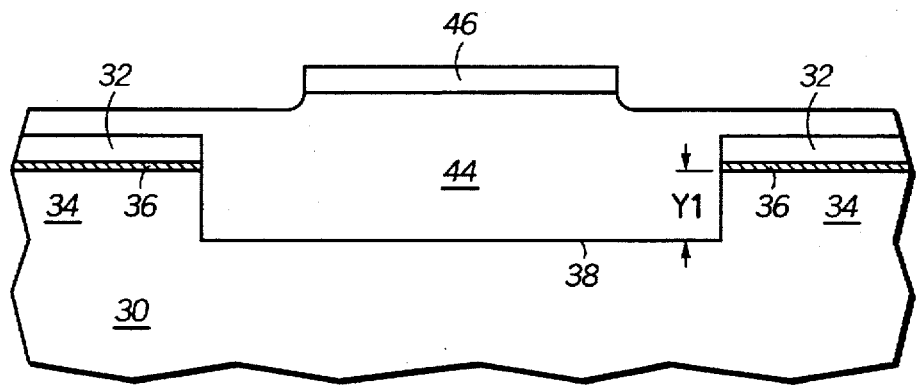
*FIG.8-a*

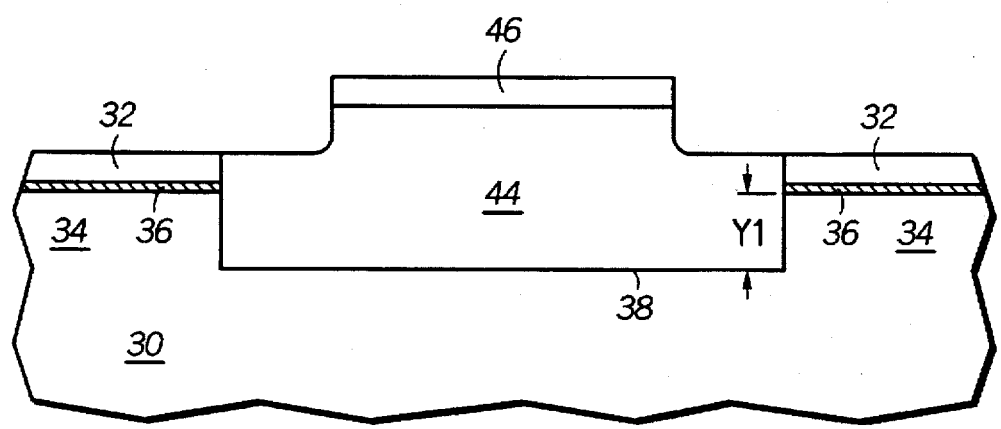
FIG. 8-b
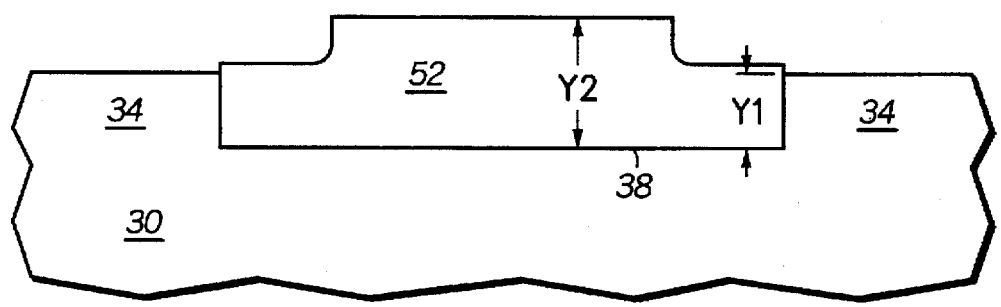
FIG. 8-c

MULTI-STEP PLANARIZATION PROCESS USING POLISHING AT TWO DIFFERENT PAD PRESSURES

FIELD OF THE INVENTION

This invention relates, in general, to a method for fabricating a semiconductor device, and more particularly to a method for polish planarizing a semiconductor device using a chemical-mechanical-polishing apparatus.

BACKGROUND OF THE INVENTION

The increasing need to form planar surfaces in semiconductor device fabrication has led to the development of process technology known as chemical-mechanical-polishing (CMP). In the CMP process, semiconductor substrates are rotated, face down, against a polishing pad in the presence of an abrasive slurry. Most commonly, the layer to be planarized is an electrically insulating layer overlying active circuit devices. As the substrate is rotated against the polishing pad, the abrasive force grinds away the surface of the insulating layer. Additionally, chemical compounds within the slurry undergo a chemical reaction with the components of the insulating layer to enhance the rate of removal. By carefully selecting the chemical components of the slurry, the polishing process can be made more selective to one type of material than to another. For example, in the presence of potassium hydroxide, silicon dioxide is removed at a faster rate than silicon nitride. The ability to control the selectivity of a CMP process has led to its increased use in the fabrication of complex integrated circuits.

A common requirement of all CMP processes is that the substrate be uniformly polished. In the case of polishing an electrically insulating layer, it is desirable to polish the layer uniformly from edge to edge on the substrate. To ensure that a planar surface is obtained, the electrically insulating layer must be uniformly removed. Uniform polishing can be difficult because several machine parameters can interact to create non-uniformity in the polishing process. For example, in the case of CMP, misalignment of the polishing wheel with respect to the platen can create regions of non-uniform polishing across the diameter of the platen. Other machine parameters, such as non-homogeneous slurry compositions, and variations in the platen pressure, and the like, can also create non-uniform polishing conditions.

Recently, CMP has been applied to the fabrication of trench isolation regions in metal-oxide-semiconductor (MOS) devices and bipolar-complementary-MOS (BiCMOS) devices. The isolation process typically includes the formation of trenches in a silicon substrate, followed by the deposition of silicon dioxide over the surface of the substrate and into the trenches. The silicon dioxide is then polished back by CMP. A polish stop layer is provided on the substrate surface to prevent the unwanted removal of underlying portions of the substrate. The silicon dioxide is ground away by the polish wheel until the polish stop layer is reached. Ideally, upon exposure of the polish stop layer, the polish removal ceases resulting in a uniformly smooth surface across the entire substrate. Important measures of the CMP process are the edge-to-edge polishing uniformity, known as global uniformity, and local uniformity. The local polishing uniformity is influenced by the material characteristics of individual regions of the substrate surface.

In a trench isolation process, local non-uniformity in a CMP process can depend upon the pattern density of isolation regions in the semiconductor substrate. Variations in pattern density can lead to variations in the polishing characteristics of the substrate within individual die in the substrate. Typically, the amount of material removed in a given amount of time depends upon the pattern density of isolation regions. For example, localized areas of nonuniform polishing can occur in substrate areas having varying degrees of pattern density. Areas having closely spaced active devices are prone to slower, but uniform, polishing due to the presence of adequate polish stop material underlying the layer being planarized. Correspondingly, in areas having a low pattern density, a smaller area of polish stop material is present, and more material is removed from the substrate. Moreover, large areas of exposed planarizing material are susceptible to dishing. The dependence of polishing characteristics on pattern density is illustrated in FIGS. 1-a and 1-b.

FIG. 1-a illustrates, in cross-section, a portion of a semiconductor substrate 10 formed in accordance with a CMP process of the prior art. The substrate includes a plurality of high-density isolation regions 12. Isolation regions, such as those illustrated, are typically employed to isolate portions of an integrated circuit device. The isolation regions are formed in a semiconductor substrate and placed in dose proximity to each other. FIG. 1-a shows a portion of substrate 10 following the planarization of the substrate. A polish stop layer 13 overlies a surface 14 of substrate 10.

FIG. 1-b illustrates, in cross-section, a portion of semiconductor substrate 10 having low-density active regions surrounded by wide isolation regions 16 formed therein. The portion of substrate 10 illustrated in FIG. 1-b is planarized by the same process used to form substrate surface 14, and surface 14 is continuous with that shown in FIG. 1-a. By comparing FIGS. 1-a and 1-b, it is seen that, following the planarization process, high-density isolation regions 12 protrude above substrate surface 14, while wide isolation regions 16 have been "dished" by the polishing process, and are recessed below substrate surface 14.

As shown in FIG. 1-a, the CMP process forms substrate surface 14 below the uppermost surface of isolation regions 12. The condition illustrated in FIG. 1-a is created by the larger quantity of polish stop material in the densely packed region of the substrate. Subsequent processing steps, which remove the polish stop layer 13 formed on the surface of substrate 10 prior to the CMP process, tend to equalize the substrate surface 14 and the uppermost surface of isolation regions 12.

In regions of the substrate containing large isolation regions, and correspondingly less polish stop material, the situation illustrated in FIG. 1-a is reversed. The initial planarization process results in removal of substantial quantities of dielectric material. In substrate regions such as that shown in FIG. 1-b, the polish stop layer 13 is reduced to a very thin layer by the polishing process. The polishing process has dished out the isolation regions 16 reducing their total thickness. The nonuniform polishing thus reduces the total thickness of isolation regions 16 as compared to isolation regions 12.

The non-uniform planarization associated with varying densities of isolation regions affects a wide variety of integrated circuit devices. Virtually all MOS and BiCMOS integrated circuits include regions of varying isolation geometry and packing densities. Accordingly, improved planarization techniques are necessary to overcome both global and localized non-uniform planarization induced by variations in the pattern-density of isolation regions.

SUMMARY OF THE INVENTION

In practicing the present invention there is provided a multi-step planarization process. In one embodiment, the pad pressure of a CMP apparatus is varied during the polish removal of a fill material overlying a semiconductor substrate. In an alternative embodiment, a fill material is partially removed by CMP processing, then the remaining fill material is etched using a polish planarization layer as an etching mask. The process of the invention enables the uniform and selective polishing of a fill material overlying a substrate. Furthermore, the process of the invention uniformly planarizes a material layer deposited over a substrate containing recessed features having a variation in lateral dimension.

BRIEF DESCRIPTION OF THE DRAWINGS

FIGS. 1-a and 1-b illustrate, in cross-section, portions of a substrate following a planarization process carried out in accordance with the prior art;

FIG. 2 illustrates a top view of a exemplary polishing apparatus for practicing the present invention;

FIGS. 4–7 illustrate, in cross-section, process steps in accordance with one embodiment of the invention; and FIGS. 8a–8c illustrate, in cross-section, a magnified portion of the semiconductor substrate illustrated in FIG. 7 showing processing steps in accordance with an alternative embodiment of the invention.

Figure 3:
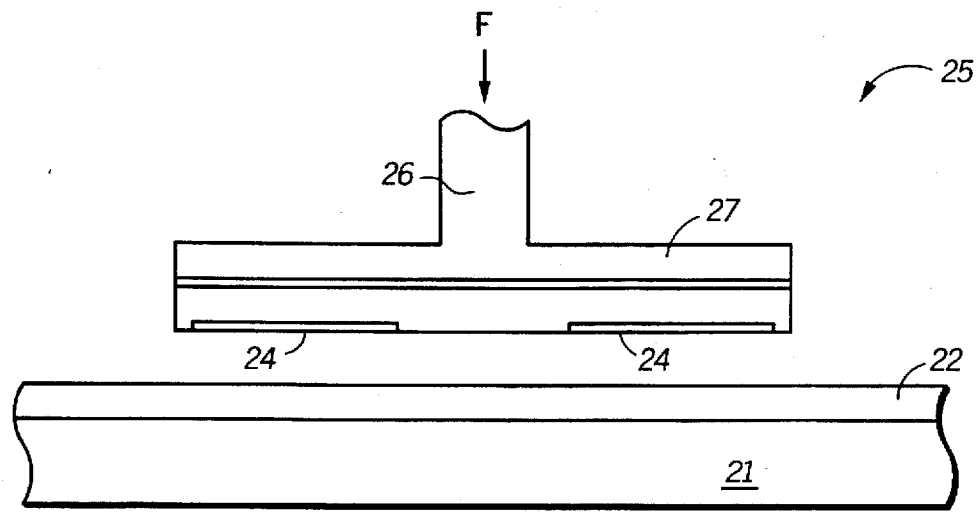
FIG. 3 illustrates, in cross-section, one embodiment for the application a variable force F to generate dynamic pad pressure during a CMP process in accordance with the invention.

It will be appreciated that for simplicity and clarity of illustration, elements shown in the FIGURES have not necessarily been drawn to scale. For example, the dimensions of some of the elements are exaggerated relative to each other. Further, where considered appropriate, reference numerals have been repeated among the FIGURES to indicate corresponding elements.

DETAILED DESCRIPTION OF PREFERRED EMBODIMENTS

The present invention provides an improved planarization process by providing, in one aspect, an additional layer of planarizing material together with the use of a dynamic pressure polishing process. The additional layer of planarizing material prevents the premature removal of all planarizing material in regions of the substrate containing large dielectric isolation regions. By providing additional planarizing material, such as an additional polish stop layer, in combination with a dynamic pressure polishing process, uniform planarization is achieved regardless of the arrangement of isolation regions in the substrate. The additional polish stop layer prevents dishing of isolation regions having a low pattern density during the CMP process.

The dynamic pressure polishing process of the invention can be carried out using one of several different kinds of CMP systems. For purpose of illustration, the present invention will be described with respect to a rotational-type multi-wafer polishing system. However, it is important to note that the present invention is not limited to the particular type of apparatus illustrated and the advantages of the invention can be realized on a single wafer polishing system, or a belt-type polishing system, or the like.

Shown in FIG. 2, in top view, is a portion of a rotational-type polishing system 20. Polishing system 20 includes a platen 21 that rotates in a clockwise direction as indicated by the arrow shown in FIG. 2. A polishing pad 22 overlies platen 21 and provides an abrasive surface for the removal of material layers brought into contact with polishing pad 22. A slurry (not shown) is dispensed onto the surface of polishing pad 22 to assist in the abrasive removal of material layers from the semiconductor substrates. The slurry is confined to the surface area of polishing pad 22 by a retaining wall 23 surrounding platen 21.

Semiconductor substrates 24 are attached to a support wheel 25 that rotates in a direction opposite to the rotational direction of platen 21. Support wheel 25 is suspended from a movable support arm 26 by a belt-driven shaft (not shown) contained within support arm 26. Material layers are removed from the surface of semiconductor substrates 24 by a frictional force created by the counter-rotation of support wheel 25 against platen 21. The polishing slurry is an abrasive lubricant that aids in the polishing process and is typically a mixture of silica particles ($Al_2O_3$) suspended in an aqueous chemical solution.

A cross sectional view of support wheel 25 together with a portion of platen 21 and polishing pad 22, is shown in FIG. 3. Support wheel 25 includes a shaft 26 attached to a mounting surface 27. An elastomeric pad 28 is attached to mounting surface 27 for receiving semiconductor substrates 24. In accordance with the invention CMP apparatus 20 includes means for applying a variable force F to support wheel 25 such that a variable contact pressure can be obtained between polishing pad 22 and semiconductor substrates 24.

In operation a frictional force is applied by the rotation of support wheel 25 against platen 21. Additional frictional force is applied through the contact pressure created by variable force F on support wheel 25. Material layers are removed from the exposed surfaces of semiconductor substrates 24 by the abrasive action and the chemical action of the polishing slurry in conjunction with the applied frictional force.

FIGS. 4–7 illustrate, in cross-section, process steps in accordance with one embodiment of the invention. It is important to note that the structure illustrated in FIGS. 4–7 is generalized to illustrate the process of the present invention. However, an actual semiconductor device, to which the process of the present invention can be applied, may appear substantially different from the generalized illustration shown in the drawing. For example, the substrate may contain additional materials, such as buried oxide layers, epitaxial layers, and the like. Also, the process of the present invention can be carried out to planarize deposited layers formed over existing device structure, such as transistors, resistors, capacitors, and the like. Therefore, the following description contemplates the application of the inventive process to a wide variety of substrate configurations and device structures.

Figure 4:
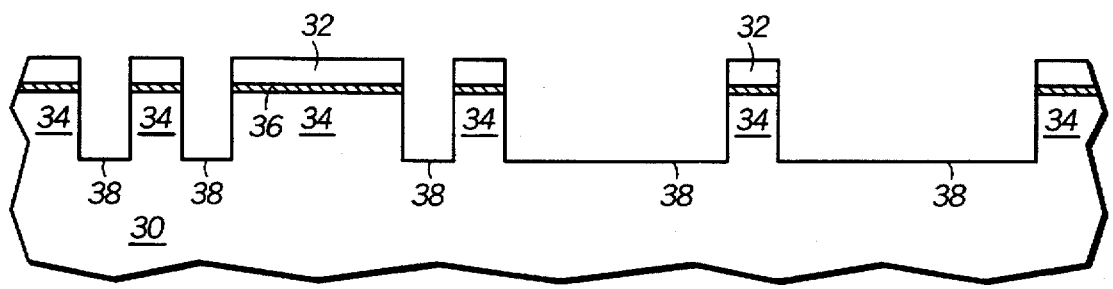

FIG. 4 illustrates, in cross-section, a portion of a semiconductor substrate 30 having already undergone several process steps in accordance with the invention. A first planarization layer 32 overlies elevated regions 34 of substrate 30. A silicon dioxide layer 36 separates first planarization layer 32 from elevated regions 34 of substrate 30. Elevated regions 34 are spaced apart by recessed regions 38. Recessed regions 38 can be used to form a variety of components for an integrated circuit device, such as isolation regions, trench capacitors, vertical bipolar transistors, vertically oriented MOS transistors, and the like. In one embodiment, recessed regions 38 are etched into substrate 30 for the purpose of forming trench isolation regions. Electrically-isolated, active device components can then be formed in the elevated regions of the substrate.

Preferably substrate 30 is processed by first thermally oxidizing the surface to form silicon dioxide layer 36. Then, first planarization layer 32 is deposited to overlie silicon dioxide layer 36. First planarization layer 32 is preferably a material capable of providing both etching resistance to a silicon etch, and providing a polish stop for a CMP planarization process. Accordingly, first planarization layer 32 can be a dielectric material such as, silicon nitride, boron nitride, boron oxynitride, silicon-rich silicon nitride, and the like. After depositing first planarization layer 32, a photolithographic mask (not shown) is formed on first planarization layer 32, and an etching process is carried out to etch substrate 30, and to form recessed regions 38. In the majority of applications for the process of the present invention, an anisotropic etching process is preferred to form substantially vertical walls in recessed regions 38. In one embodiment, a reactive ion etching process using chlorinated etching gases is carried out to form recessed regions 38.

Figure 5:
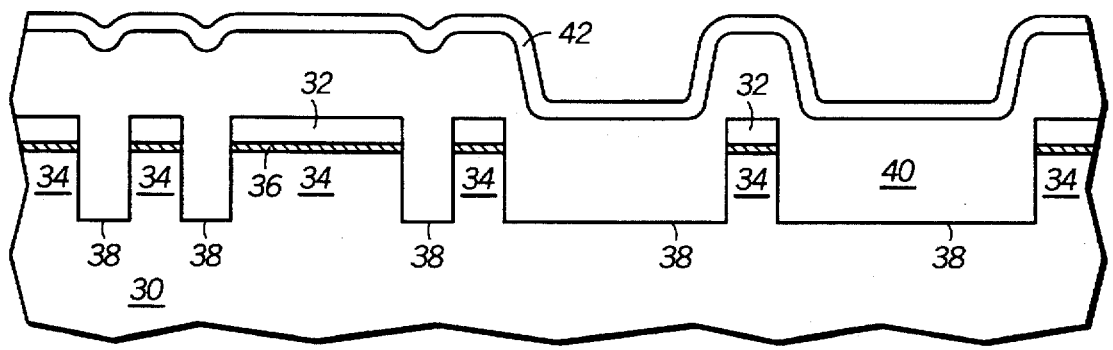

The illustrative process of the invention continues with the deposition of a fill material 40, as illustrated in FIG. 5. The fill material overlies first planarization layer 32 and fills recessed regions 38. In the fabrication of isolation regions, fill material 40 is a dielectric material, such as silicon dioxide. Preferably, fill material 40 is silicon dioxide deposited by chemical vapor deposition using tetraethylorthosilane (TEOS) source gas. Alternatively, fill material 40 can be silicon dioxide deposited by an atmospheric deposition process, or another dielectric material, which is differentially etchable with respect to first planarization layer 32.

After depositing fill material 40, a second planarization layer 42 is deposited to overlie fill material 40. Preferably, second planarization layer 42 is a material similar to first planarization layer 32. In a preferred embodiment, second planarization layer 42 is silicon nitride deposited by chemical vapor deposition to a thickness of about 300–500 angstroms. The conformal deposition characteristics of chemically deposited silicon nitride results in the formation of a uniformly thick coating of silicon nitride over the surface topography of substrate 30.

Once second planarization layer 42 is formed, a dynamic pressure polishing process is used to form a planar surface on substrate 30. Using a polishing system, such as polishing system 20, a first portion of fill material 40 is removed at a first contact pressure. Preferably, the first contact pressure is about 7.0 to 15.0 pounds-per-square-inch (psi) and generates a polishing selectivity of about 3:1. The polishing selectivity is defined as the polish removal rate of fill material 40 to the polish removal rate of second planarizing layer 42.

As illustrated in FIG. 6, after the first polishing step, a second portion 44 of fill material 40 remains overlying semiconductor substrate 30. In addition, a portion 46 of second planarization layer 42 remains in the recessed areas of second portion 44. Following fie removal a first portion of fill material 40 and a portion of second planarizing layer 42, the remaining portions 44 are removed by CMP system 20 using a second contact pressure. Preferably, the second contact pressure is about 2.5 to 5.0 psi and generates a polishing selectivity of about 10:1. Thus, the dynamic pressure polishing process of the invention advantageously provides a technique for rapidly removing a large amount of a material, such as fill material 40, while providing the needed selectivity upon clearing of the material layer.

As illustrated in FIG. 7, a planar surface 47 is formed by the uniform and selective polishing of fill material 40. The formation of planar surface 47 is aided by the planarizing layers 32 overlying elevated regions 34 of substrate 30, and by remaining portions 46 of second planarizing layer 42. The presence of additional planarizing material prevents the over-planarization of regions of substrate 30 containing large isolation regions.

The polishing process also forms isolation regions 48 and 50 in substrate 30. Isolation regions 48 are formed in areas of substrate 30 containing a relatively large amount of planarization material. Correspondingly, isolation regions 50 are formed in areas of substrate 30 containing a relatively smaller amount of planarization material. However, the presence of additional planarization material, together with the dynamic pressure polishing process results in the uniform and selective polish removal of fill material 40, such that planar surface 47 extends over the entire area of substrate 30.

Once a uniform planar surface is formed, the uniformity can be preserved as the various materials overlying the surface are removed by subsequent processing. For example, after removing remaining portions of first and second planarization layers 32 and 46, and etching away remaining portions of silicon dioxide layer 36, planar surface 47 is propagated into substrate 30. Because of the initial formation of planar surface 47 by the dynamic pressure CMP process, the subsequent removal of planarization material and dielectric material maintains the planar characteristics of planar surface 47. Accordingly, once remaining portions of the planarization layers and the fill material are removed, a planar surface is retained on the substrate.

A process in accordance with an alternative embodiment of the invention is illustrated in FIGS. 8a–8c, where a magnified portion of semiconductor substrate 30 is shown. In the alternative process embodiment fill material 40 is deposited to a thickness greater than the vertical separation distance between recessed regions 38 and elevated regions 34. The vertical separation distance is denoted as "y1." Then, second planarization layer 46 is deposited onto fill material 40 and a planarization process is carried out to remove a portion fill material 40 and to leave a remaining portion 44. As illustrated in FIG. 8a, the planarization process is stopped before all of fill material 40 is removed over elevated regions 34 of semiconductor substrate 30.

Referring to FIG. 8b, an etching process is carried out to remove regions of remaining portion 44 exposed by second planarization layer 46. The etching process preferentially etches fill material, while not substantially either etching first planarization layer 32 or second planarization layer 46. In the case where the fill material is silicon dioxide and the planarization material is silicon nitride, the selective etch can be either a dry plasma etch using fluorine based etching gases, or alternatively, a wet chemical etch using a chemical solution containing hydrofluoric acid.

Upon completion of the etching process and removal of second planarization layer 46, a contoured isolation region 52 is formed over recessed region 38. The etching process produces a thick region having a vertical thickness, denoted "y2" in FIG. 8c. The periphery of isolation region 52 has a thickness equal to the vertical separation distance "y1", plus the deposited thickness of first planarization layer 32 and silicon dioxide layer 36.

The regions of varying thickness in isolation region 52 created by the alternative process embodiment advantageously provide a means of optically aligning photomasks to isolation region 52. Photolithographic alignment is aided by the difference in light refraction in the regions of isolation region 52 having thickness "y2", versus the light refraction in regions having thickness "y1." The ability to precisely align photomasks to isolation regions formed in accordance with the alternative embodiment improves the quality of device fabrication. This is especially important in devices having extremely small feature sizes, such as devices having gate lengths below 0.5 microns.

Thus it is apparent that there has been provided, in accordance with the invention, a multi-step planarization process which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, many different kinds of processing equipment, such as cluster tools and X-ray and UV lithography systems, and the like, can be used in the process of the invention. It is therefore intended to include within the invention all such variations and modifications as fall within the scope of the appended claims and equivalents thereof.

We claim:

1. A process for fabricating a semiconductor device comprising the steps of:

providing a semiconductor substrate having elevated regions and recessed regions therein, wherein a first planarization layer overlies the elevated regions;

depositing a fill material to overlie the first planarization layer and the recessed regions;

forming a second planarization layer to overlie the fill material wherein the second planarization material is not lithographically patterned to expose any portion of the underlying fill material;

chemical-mechanical-polishing a first portion of the fill material using a polishing apparatus having a polishing pad, wherein the first portion is planarized using a first pad pressure; and chemical-mechanical-polishing a second portion of the fill material using a second pad pressure, wherein the first pad pressure is greater than the second pad pressure.

2. The process of claim 1, wherein the step of depositing a fill material comprises chemical vapor deposition of silicon dioxide.

3. The process of claim 1, wherein the step of forming a second planarization layer comprises depositing a layer selected from the group consisting of silicon nitride, boron nitride, silicon-rich silicon nitride, and boron oxynitride.

4. The method of claim 1 wherein the first polishing pad pressure is substantially within a range of 7.0–15.0 psi and the second polishing pad pressure substantially within a range of 2.5–5.0 psi.

5. The method of claim 1 wherein the first polishing pad pressure is set so that a polishing selectively of fill material to second planarization layer is substantially 3:1 in the first time period and setting the second polishing pad pressure so that a polishing selectively of fill material to second planarization layer is substantially 10:1 in the second time period.

6. A process for fabricating a semiconductor device comprising the steps of:

providing a semiconductor substrate having a plurality of elevated regions and a plurality of recessed regions therein, wherein a portion of the recessed regions are characterized by a first horizontal distance, and wherein a portion of the recessed regions are characterized by a second horizontal distance, and wherein the second horizontal distance is different from the first horizontal distance, and wherein a first planarization layer overlies the elevated regions;

depositing a fill material to overlie the first planarization layer and the plurality of recessed regions;

forming a second planarization layer to overlie the fill material wherein the second planarization material is not lithographically patterned to expose any portion of the underlying fill material;

chemical-mechanical-polishing a first portion of the fill material using a polishing apparatus having a polishing pad, wherein the first portion is planarized at a first pad pressure; and chemical-mechanical-polishing a second portion of the fill material at a second pad pressure, wherein the first pad pressure is greater than the second pad pressure.

7. The process of claim 6, wherein the step of depositing a fill material comprises chemical vapor deposition of silicon dioxide.

8. The process of claim 6, wherein the step of forming a second planarization layer comprises depositing a layer selected from the group consisting of silicon nitride, boron nitride, silicon-rich silicon nitride, and boron oxynitride.

9. The method of claim 6 wherein the first polishing pad pressure is substantially within a range of 7.0–15.0 psi and the second polishing pad pressure substantially within a range of 2.5–5.0 psi.

10. The method of claim 6 wherein the first polishing pad pressure is set so that a polishing selectively of fill material to second planarization layer is substantially 3:1 in the first time period and setting the second polishing pad pressure so that a polishing selectively of fill material to second planarization layer is substantially 10:1 in the second time period.

11. A process for fabricating a semiconductor device comprising the steps of:

providing a substrate having elevated regions vertically separated from recessed regions by a separation distance;

forming a first planarization layer overlying the elevated regions;

depositing a fill material on the substrate to a thickness greater than the separation distance;

forming a second planarization layer to overlie the fill material;

removing a first portion of the fill material and a first portion of the second planarization layer, and leaving a second portion of the fill material and a second portion of the second planarization layer, the step of removing being performed by polishing the wafer during a first time period at a first polishing pad pressure and polishing the wafer during a second time period at a second polishing pad pressure wherein the second time period follows the first time period and wherein the second polishing pad pressure is less than the first polishing pad pressure;

etching the second portion of the fill material using the second portion of the second planarization layer as an etch mask; and removing the second portion of the second planarization layer whereby the second portion of the fill material remains overlying the recessed regions.

12. The process of claim 11, wherein the step of depositing a fill material comprises chemical vapor deposition of silicon dioxide.

13. The process of claim 12, wherein the step of etching the second portion of the fill material comprises selectively etching the silicon dioxide in preference to the first and second planarization layers.

14. The method of claim 11 wherein the step of removing a first portion of the fill material and a first portion of the second planarization layer comprises:

removing the first portion of the fill material and the first portion of the second planarization layer so that the second portion of the fill material which remains overlying the recessed regions defines a topographical pattern which is used to perform a subsequent lithographic alignment operation.

15. The method of claim 11 wherein the step of removing a first portion of the fill material and a first portion of the second planarization layer comprises:

setting the first polishing pad pressure substantially within a range of 7.0–15.0 psi and setting the second polishing pad pressure substantially within a range of 2.5–5.0 psi.

16. The method of claim 11 wherein the step of removing a first portion of the fill material and a first portion of the second planarization layer comprises:

setting the first polishing pad pressure so that a polishing selectively of fill material to second planarization layer is substantially 3:1 in the first time period and setting the second polishing pad pressure so that a polishing selectively of fill material to second planarization layer is substantially 10:1 in the second time period.

17. A process for fabricating a semiconductor device comprising the steps of:

providing a semiconductor substrate having elevated regions and recessed regions therein, wherein a first planarization layer overlies the elevated regions;

depositing a fill material to overlie the first planarization layer and the recessed regions;

forming a second planarization layer to overlie the fill material;

providing a chemical-mechanical-polishing apparatus having a polishing pad and means for variably applying a contact pressure between the polishing pad and the semiconductor substrate;

polishing a first portion of the fill material, wherein the first portion is polished at a first contact pressure wherein the first contact pressure is created by the means for variably applying a contact pressure so that a polishing selectivity ratio between the fill material and the second planarization layer is N:1, N being a finite positive number; and polishing a second portion of the fill material at a second contact pressure wherein the second contact pressure is created by the means for variably applying a contact pressure so that a polishing selectivity ratio between the fill material and the second planarization layer is M:1, M being a finite positive number, wherein the first contact pressure is greater than the second contact pressure and wherein M is greater than N.

18. The process of claim 17, wherein the step of depositing a fill material comprises chemical vapor deposition of silicon dioxide.

19. The process of claim 17, wherein the step of forming a second planarization layer comprises depositing a layer selected from the group consisting of silicon nitride, boron nitride, silicon-rich silicon nitride, and boron oxynitride.

20. The method of claim 17 wherein N is substantially equal to 3 and M is substantially equal to 10.

* * * * *